(12) United States Patent
Takata

(10) Patent No.: US 6,573,543 B2
(45) Date of Patent: Jun. 3, 2003

(54) RESET APPARATUS, SEMICONDUCTOR IC APPARATUS, AND SEMICONDUCTOR MEMORY APPARATUS

(75) Inventor: Hidekazu Takata, Nara (JP)

(73) Assignee: Sharp Kabushika Kaisha, Osaka (JP)

( * ) Notice: Subject to any disclaimer, the term of this patent is extended or adjusted under 35 U.S.C. 154(b) by 0 days.

(21) Appl. No.: 09/967,664

(22) Filed: Sep. 28, 2001

(65) Prior Publication Data

US 2003/0062552 A1 Apr. 3, 2003

(30) Foreign Application Priority Data

Sep. 28, 2000 (JP) .................................... 2000-297663

(51) Int. Cl.[7] ............................................. H01L 29/82
(52) U.S. Cl. ................... 257/295; 257/293; 257/294; 257/296; 365/145; 365/149; 365/161; 327/142; 327/143; 327/147; 307/296.5; 307/272.3; 324/103; 324/72; 324/457

(58) Field of Search ........................ 257/295, 296, 257/294, 293; 327/147, 198, 142, 143, 536, 537; 365/145, 149, 161; 324/103, 72, 457; 307/296.5, 272.3

(56) References Cited

U.S. PATENT DOCUMENTS

| 3,274,567 | A |   | 9/1966  | Fatuzzo |
|-----------|---|---|---------|---------|
| 5,166,546 | A | * | 11/1992 | Savignac et al. ........ 307/296.5 |
| 5,332,962 | A | * | 7/1994  | Sameshima ................ 324/103 |
| 6,005,423 | A | * | 12/1999 | Schultz ....................... 327/143 |
| 6,229,730 | B1 | * | 5/2001  | Kato .......................... 365/145 |
| 6,278,316 | B1 | * | 8/2001  | Tanzawa et al. ........... 327/536 |

* cited by examiner

Primary Examiner—Nathan J. Flynn
Assistant Examiner—Fazli Erdem
(74) Attorney, Agent, or Firm—Morrison & Foerster LLP

(57) ABSTRACT

A reset device detects a rise of a supply voltage to start outputting a reset signal. The reset device includes a voltage detection circuit for detecting the supply voltage. The voltage detection circuit includes a ferroelectric capacitance element for detecting the supply voltage.

19 Claims, 4 Drawing Sheets

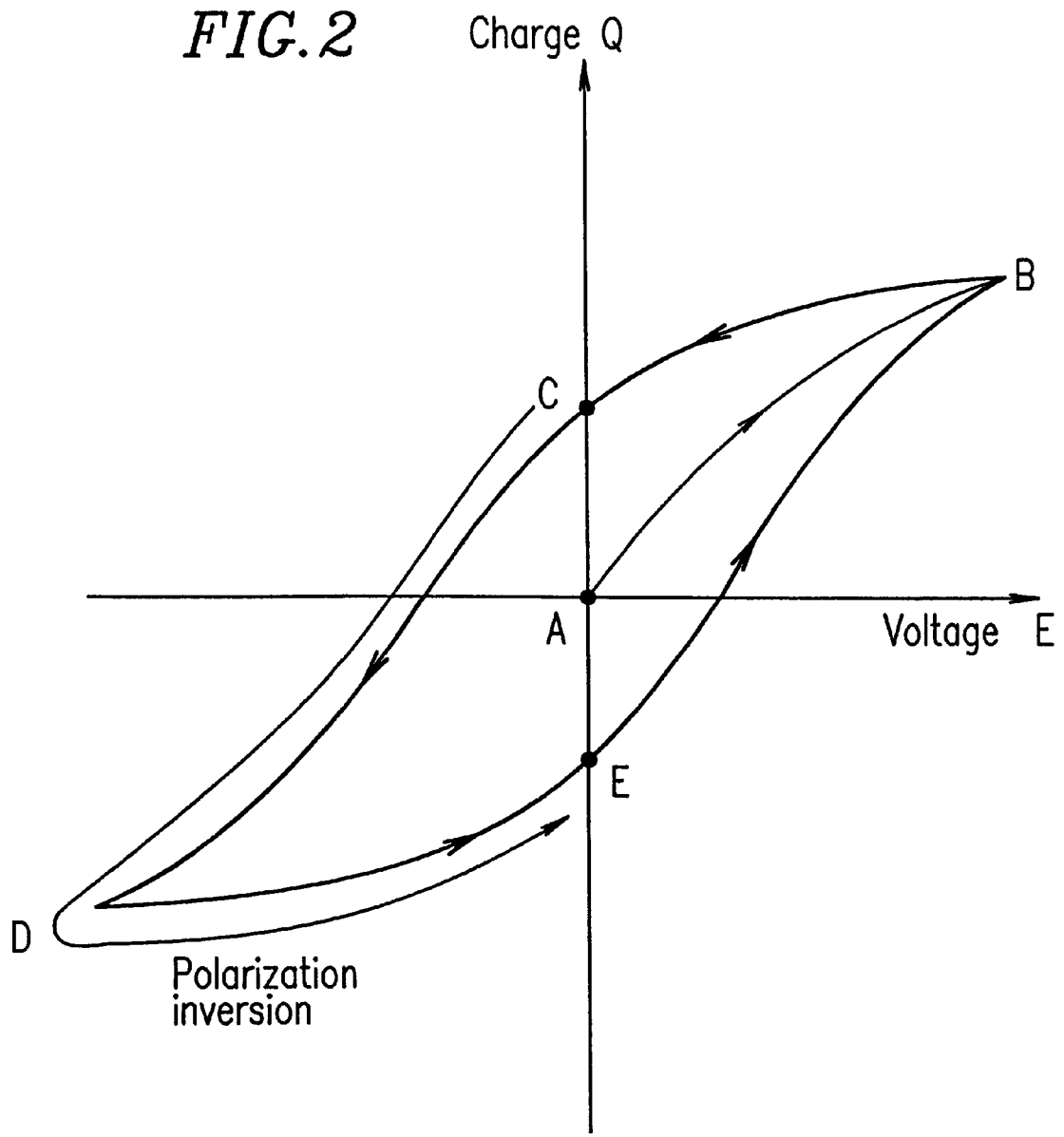

FIG.3A
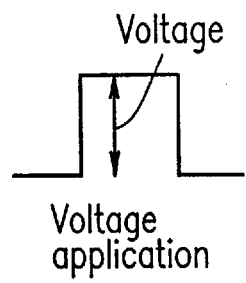
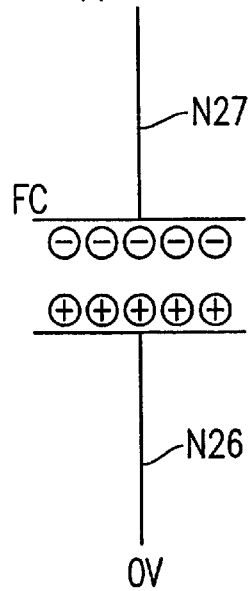
FIG.3B
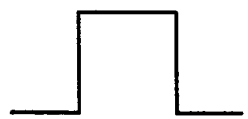
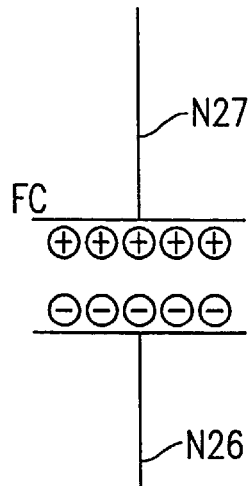
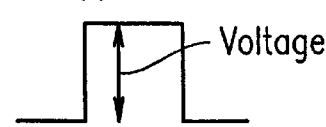
FIG.4
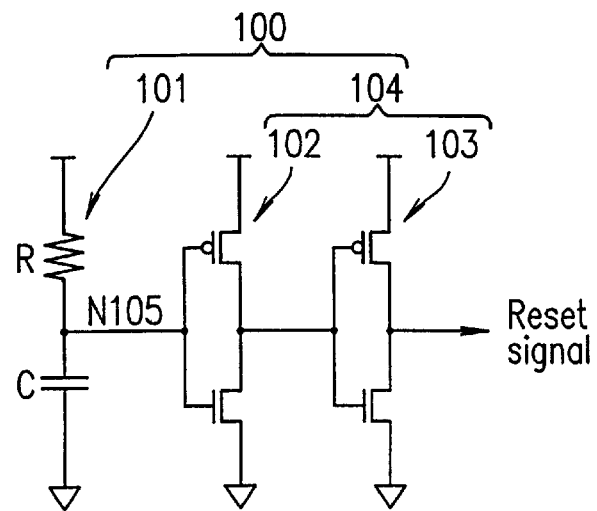

US 6,573,543 B2

RESET APPARATUS, SEMICONDUCTOR IC APPARATUS, AND SEMICONDUCTOR MEMORY APPARATUS

CROSS REFERENCE TO RELATED APPLICATIONS

This application claims priority to Japanese Patent Application Number 2000-297663 filed Sep. 28, 2000, the content of which is incorporated herein by reference in its entirety.

BACKGROUND OF THE INVENTION

1. Field of the Invention

The present invention relates to a reset device (or apparatus) for detecting, for example, a rise of a supply voltage so as to start outputting a reset signal and then releasing the reset signal, and a semiconductor IC apparatus (or device) and a semiconductor memory apparatus (or device) including the reset device.

2. Description of the Related Art

Conventional techniques for resetting for initialization of a system include, for example, (i) so-called hardware reset by which the system is allowed to be initialized from a terminal dedicated to resetting, asynchronously with the operation of the system, (ii) power-on reset by which a reset signal for initializing a system is automatically generated when the power is turned on, and (iii) software reset by which the system is initialized by generating a reset signal by interpreting a command which is input from an external device. The power-on reset used in a conventional reset device will be described.

The reset device includes a supply voltage detection circuit for detecting a supply voltage by some method in order to determine whether the power is turned on or not, and a reset signal output circuit for starting to output a reset signal and then releasing the reset signal based on the detection of the supply voltage.

FIG. 4 shows a simple example of a circuit configuration of such a conventional reset device. Referring to FIG. 4, a reset device 100 includes a supply voltage detection circuit 101 including a capacitor C (dielectric capacitor) and a resistor R connected in series, and a reset signal output circuit 104 including a first-stage inverter 102 and a second-stage inverter 103 connected in series. The inverters 102 and 103 each include a p-channel MOS transistor (hereinafter, referred to as the "p-channel Tr) and an n-channel MOS transistor (hereinafter, referred to as the "n-channel Tr).

Due to the above-described structure, when the supply voltage rises, the capacitor C of the supply voltage detection circuit 101 is charged through the resistor R at a prescribed time constant RC. The voltage which is generated at the resistor R by the charging current is given to the first-stage inverter 102, including the p-channel Tr and the n-channel Tr, through a node N105. At this point, the capacitor C is not charged rapidly. The node N105 is in a logical "low" state, and the reset signal which is output from the reset signal output circuit 104 is also in an active logical "low" state.

Next, when the potential of the node N105 increases as the capacitor C is more and more charged and exceeds a gate threshold voltage which is mainly determined by the threshold voltages and the driving capabilities of the p-channel Tr and the n-channel Tr of the first-stage inverter 102, the output of the first-stage inverter 102 inverts to a logical "low" state. The logical "low" output is sent to the second-stage inverter 103, and inverted into a logical "high" state.

Thus, the reset signal which is output from the reset signal output circuit 104 is released. A value of the time constant RC of the capacitor C and the resistor R (C×R) is appropriately selected so that the supply voltage is at a sufficiently high level for a sufficiently long reset time which is required for the system. The reset time is a time period from when the output of the reset signal is started until the reset signal is released.

However, when the rise of the supply voltage when the power is turned on is sufficiently slow such that the capacitor C is fully charged only at the end of a duration corresponding to the time constant RC, there is an undesirable possibility that the potential of the node N105 does not reach the gate threshold voltage of the inverter 102, and as a result, the reset signal from the reset signal output circuit 104 may not be released.

In order to avoid such an inconvenience, a reset signal device 200 shown in FIG. 5 including a supply voltage detection circuit dedicated to the case when the supply voltage slowly rises and another supply voltage detection circuit dedicated to the case when the supply voltage rapidly rises is used. Referring to FIG. 5, the reset device 200 includes a supply voltage detection circuit 201 operating when the supply voltage slowly rises, a supply voltage detection circuit 202 operating when the supply voltage rapidly rises, and a reset signal output circuit 203 for starting to output a reset signal and releasing the reset signal in accordance with signals input from the supply voltage detection circuit 201 and 202.

The supply voltage detection circuit 201 has the following structure. Resistors R1 and R2 are connected in series between a power supply and the ground. A node N1, which is a dividing point (i.e., a connection point) between the resistors R1 and R2, is connected to one of two ends of a capacitor C1 (dielectric capacitor) and to a gate of an n-channel Tr M1. The other end of the capacitor C1 is connected to the power supply. A source of the n-channel Tr M1 is grounded, and a drain of the n-channel Tr M1 is connected to the power supply via a pull-up resistor R3. A node N2, which is a connection point between the n-channel Tr M1 and the pull-up resistor R3, is connected to an input end of an inverter 210 including a p-channel Tr M2 and an n-channel Tr M3.

The supply voltage detection circuit 202 has the following structure. A p-channel Tr M4, a resistor R4, and an n-channel Tr M5 and another n-channel Tr M6 each having a gate connected to a power supply are connected in series in this order. A node N3, which is a connection point between the n-channel Tr M5 and the resistor R4, is connected to a capacitor C2 (dielectric capacitor) and to an input end of an inverter 220 including a p-channel Tr M7 and an n-channel Tr MB. To a gate of the p-channel Tr M4, a reset signal is input as a result of being fedback.

The reset signal output circuit 203 includes a negative OR circuit, which includes a NAND circuit NAND1 for receiving an output from each of the supply voltage detection circuits 201 and 202, and an inverter 230 for receiving an output from the NAND circuit NAND1 and starting to output a reset signal or releasing the reset signal. The inverter 230 includes a p-channel Tr M9 and an n-channel Tr M10.

The n-channel Trs M8 and M10 each have a low threshold voltage, and thus are specifically indicated as in FIG. 5.

Hereinafter, an operation of the reset device 200 when the supply voltage slowly rises will be described.

Immediately after the power is turned on, the potential of the node N2 is in a logical "high" state as a result of being pulled up via the resistor R3. Therefore, the output from the inverter 210 (i.e., the output from the supply voltage detection circuit 201) is in a logical "low" state. Thus, the output from the NAND circuit NAND1 is in a logical "high" state regardless of whether the input from the supply voltage detection circuit 202 is in a logical "high" state or a logical "low" state. Therefore, the reset signal, which is output from the inverter 230 (i.e., the output from the reset signal output circuit 203), is in an active logical "low" state (i.e., the state of outputting a reset signal).

In the case where the supply voltage slowly rises, even when a sufficient amount of current does not flow into the capacitor C1, a potential which is lower than the supply voltage divided into the resistors R1 and R2 connected in series is input to the gate of the n-channel Tr M1 via the node N1. When the potential of the node N1 exceeds the threshold voltage of the n-channel Tr M1, the n-channel Tr M1 is activated. Therefore, the node N2 is transferred from the logical "high" state obtained immediately after the power is turned on into a logical "low" state. Thus, the output from the inverter 210 is logically inverted into a logical "high" state. Then, a logical "high" output is sent from the supply voltage detection circuit 201 to the NAND circuit NAND1.

In the supply voltage detection circuit 202, since the supply voltage rises sufficiently slowly to charge the capacitor C2, the node N3 is placed into a logical "low" state via the n-channel Trs M5 and M6 which are activated as a result of the gates being connected to the power supply. Since the node N3 is in the logical "low" state, the output from the supply voltage detection circuit 202 is in a logical "high" state as a result of being inverted by the inverter 220. Therefore, a logical "low" output is sent from the NAND circuit NAND1 to the inverter 230. As a consequence, a reset signal which is output from the reset signal output circuit 203 is transferred from the active logical "low" state obtained immediately after the power is turned on into a logical "high" state and thus is released.

The reset signal from the reset signal output circuit 203 is in the logical "high" state as described above. The output from the supply voltage detection circuit 201 is more effective than the output from the supply voltage detection circuit 202. The reset signal from the reset signal output circuit 203 is as effective as the output from the supply voltage detection circuit 201 (in a logical high state) which is output as a reset signal without the logical state thereof being changed and then released.

Next, an operation of the reset device 200 when the supply voltage rapidly rises will be described.

In the supply voltage detection circuit 201, since the supply voltage rapidly rises, the potential of the node N1 is raised to the supply voltage via the capacitor C1. As a result, the n-channel Tr M1 is activated and thus the node N2 is placed into a logical "low" state substantially simultaneously with the rise of the supply voltage. Therefore, the output from the inverter 210 is in a logical "high" state. Thus, an active "low" output is not sent from the supply voltage detection circuit 201.

In the supply voltage detection circuit 202, the potential of the node N3 is raised to the supply voltage via the capacitor C2 so as to activate the n-channel Tr M8. Even though the n-channel Trs M5 and M6 are connected in series to the ground, the potential of the node N3 is easily raised due to high resistances of the n-channel Trs M5 and M6. The activation of the n-channel Tr M8 provides a rapid response since the n-channel Tr M8 has a low threshold voltage. Substantially simultaneously with the rise of the supply voltage, the inverter 220 is placed into a logical "low" state and input to the NAND circuit NAND1. Therefore, the output from the NAND circuit NAND1 is in a logical "high" state regardless of whether the input to the NAND circuit NAND1 is in a logical "low" state or in a logical "high" state. As a consequence, a reset signal is output in an active logical "low" state. In the case where the supply voltage rapidly rises, the output from the supply voltage detection circuit 202 is more effective than the output from the supply voltage detection circuit 201.

Thereafter, the capacitor C2 is discharged via the n-channel Trs M5 and M6 which are activated by the rise of the supply voltage, and thus the node N3 is transferred into a logical "low" state. Thus, the output from the supply voltage detection circuit 202 is placed into a logical "high" state. As a consequence, a reset signal which is output from the reset signal output circuit 203 (negative OR circuit) is transferred from the active "low" state into a logical "high" state and thus is released.

While the reset signal is in the active logical "low" state, the logical "low" state is fedback to the gate of the p-channel Tr M4 so as to activate the p-channel Tr M4. A current flows to the n-channel Trs M5 and M6 via the resistor R4 and acts so as to inhibit the discharge of the charges accumulated in the capacitor C2. In this manner, a sufficient time period can be obtained until the reset signal is released.

When the discharge of the capacitor C2 is completed, the node N3 is placed into a logical "low" state, which places the output from the supply voltage detection circuit 202 into a logical "high" state. Thus, the reset signal is placed into a logical "high" state, which de-activates the p-channel Tr M4. Therefore, the serial path from the power supply to the ground via the p-channel Tr M4, the resistor R4, the n-channel Tr M5 and the n-channel Tr M6 is broken, and the DC current flowing thereafter is cut off.

The reset device 200 shown in FIG. 5 has the following problems.

(1) Since a serial circuit of the resistors R1 and R2 is connected between the power supply and the ground in the supply voltage detection circuit 201, a serial path is made even after the supply voltage rises. As a result, even after the supply voltage rises, the current still flows in the serial circuit of the resistors R1 and R2, which unnecessarily increases the power consumption.

(2) It is necessary to switch the supply voltage detection circuit 201 or 202 depending on whether the supply voltage rises slowly or rapidly. The switching operation relies on the capacitances of the capacitors C1 and C2, the resistances of the resistors R1 through R4, and characteristics of the transistors M1 through M10 as parameters of the supply voltage detection circuits 201 and 202. In consideration of the dispersion of the capacitances, the resistances and the characteristics, it is difficult to control the parameters so as to stably perform the switching operation.

(3) Today, it is strongly desired to reduce the power consumption, as an increasing number of devices designed so as to be driven by batteries are provided. It has become essential that the system should operate at a low supply voltage to significantly contribute to the energy savings. Under the circumstances, a power-on reset circuit which stably performs a reset operation even at a low voltage is demanded.

SUMMARY OF THE INVENTION

A reset device according to the present invention detects a rise of a supply voltage to start outputting a reset signal and then to release the reset signal. The reset device comprising a voltage detection circuit for detecting the supply voltage. The voltage detection circuit includes a ferroelectric capacitance element for detecting a rise of the supply voltage.

In one embodiment of the invention, the reset device further includes a reset signal output section for generating a reset signal using a polarization characteristic of the ferroelectric capacitance element, and a reset signal release section for releasing the reset signal.

In one embodiment of the invention, the reset device further includes an initial polarization state setting section for determining a polarization state of the ferroelectric capacitance element.

In one embodiment of the invention, the reset device further includes a polarization state initialization section for returning the polarization state of the ferroelectric capacitance element to an initial polarization state after the reset signal is released.

In one embodiment of the invention, the polarization state initialization section includes a pulse generation circuit having an input end connected to an input end of a first inverter of the voltage detection circuit, the polarization state initialization section generating a polarization state initialization pulse from an output end thereof to a second end of the ferroelectric capacitance element.

In one embodiment of the invention, the reset signal release section includes a second inverter, a second pass transistor, a delay circuit, and a reset signal release transistor. A connection point between a pull-up resistor and a reset signal driving transistor is connected to an input end of the second inverter. The input end of the second inverter is connected to a control terminal of the second pass transistor. An output end of the second inverter is connected to one of two driving terminals of the second pass transistor. The other driving terminal of the second pass transistor is connected to an input end of a first inverter via the delay circuit. The input end of the first inverter is connected to a control terminal of the reset signal release transistor. One of two driving terminals of the reset signal release transistor is connected to a control terminal of the reset signal driving transistor. The other driving terminal of the reset signal release transistor is grounded.

In one embodiment of the invention, the reset signal output section includes a reset signal driving transistor and a pull-up resistor. A second end of the ferroelectric capacitance element is connected to a control terminal of the reset signal driving transistor via a first pass transistor, which has a control terminal connected to an output end of a first inverter. One of two driving terminals of the reset signal driving transistor is connected to a first end of the pull-up resistor, which has a second end connected to a power supply. The other driving terminal of the reset signal driving transistor is grounded.

In one embodiment of the invention, the reset signal release section includes a second inverter, a second pass transistor, a delay circuit, and a reset signal release transistor. A connection point between the pull-up resistor and the reset signal driving transistor is connected to an input end of the second inverter. The input end of the second inverter is connected to a control terminal of the second pass transistor. An output end of the second inverter is connected to one of two driving terminals of the second pass transistor. The other driving terminal of the second pass transistor is connected to an input end of the first inverter via the delay circuit. The input end of the first inverter is connected to a control terminal of the reset signal release transistor. One of two driving terminals of the reset signal release transistor is connected to the control terminal of the reset signal driving transistor. The other driving terminal of the reset signal release transistor is grounded.

In one embodiment of the invention, the reset device further includes a polarization state initialization section for returning a polarization state of the ferroelectric capacitance element to an initial polarization state after the reset signal is released.

In one embodiment of the invention, the polarization state initialization section includes a pulse generation circuit having an input end connected to an input end of a first inverter of the voltage detection circuit, the polarization state initialization section generating a polarization state initialization pulse from an output end thereof to a second end of the ferroelectric capacitance element.

In one embodiment of the invention, the polarization state initialization section has a structure in which a pull-down transistor is connected to a first end of the ferroelectric capacitance element, and a pull-up transistor is connected to a second end of the ferroelectric capacitance element.

In one embodiment of the invention, the reset device further includes an initial polarization state setting section for determining a polarization state of the ferroelectric capacitance element.

In one embodiment of the invention, the reset device further includes a polarization state initialization section for returning the polarization state of the ferroelectric capacitance element to an initial polarization state after the reset signal is released.

In one embodiment of the invention, the polarization state initialization section includes a pulse generation circuit having an input end connected to an input end of a first inverter of the voltage detection circuit, the polarization state initialization section generating a polarization state initialization pulse from an output end thereof to a second end of the ferroelectric capacitance element.

In one embodiment of the invention, the polarization state initialization section has a structure in which a pull-down transistor is connected to a first end of the ferroelectric capacitance element, and a pull-up transistor is connected to a second end of the ferroelectric capacitance element.

In one embodiment of the invention, the voltage detection circuit detects the rise of the supply voltage by a polarization inversion so that the reset signal is generated by a transfer of a potential of the ferroelectric capacitance element caused by the polarization inversion.

In one embodiment of the invention, the voltage detection circuit includes a first inverter. An input end of the first inverter is grounded via a dielectric capacitance element and a pull-down resistor. An output end of the first inverter is connected to a first end of the ferroelectric capacitance element.

In one embodiment of the invention, the voltage detection circuit includes a first inverter. An input end of the first inverter is grounded via a dielectric capacitance element and a pull-down resistor. An output end of the first inverter is connected to a first end of the ferroelectric capacitance element.

According to another aspect of the invention, a semiconductor IC apparatus includes the above-described reset device which is formed using a semiconductor material.

According to still another aspect of the invention, a semiconductor memory apparatus includes the above-described semiconductor IC apparatus.

According to the present invention, the ferroelectric capacitance element provided in the voltage detection circuit keeps a residual polarization due to the hysteresis characteristic thereof and thus does not charge or discharge relying on time unlike a dielectric capacitor. Therefore, consumption of a current during the operation of the circuit and a serial path required in the conventional art can be eliminated. As a result, constant current consumption is eliminated, resulting in reduced power consumption. By selecting an appropriate ferroelectric material used for the ferroelectric capacitance element and an appropriate thickness of the ferroelectric capacitance element, the polarization inversion voltage can be minimized. Thus, a stable operation is guaranteed even at a low voltage. The polarization caused to the ferroelectric material is spontaneous polarization induced by the electric field applied thereto and thus does not accompany injection or release of charges to or from an external device unlike the dielectric capacitor. Therefore, the polarization inversion is performed rapidly. The polarization inversion is controlled only by an electric field, i.e., a voltage supplied from an external device. Therefore, the polarization inversion does not rely on the rising time of the voltage, and a voltage detection circuit which is sufficiently easily controlled is realized. As a result, a reset circuit providing a stable operation is realized.

According to the present invention, a reset signal can start being output and then be released relatively easily using a polarization characteristic of the ferroelectric capacitance element.

According to the present invention, the initial polarization state of the ferroelectric capacitor can be easily and arbitrarily determined by the initial polarization state setting section.

According to the present invention, after the supply voltage rises to release the reset signal, the polarization state of the ferroelectric capacitance element can be easily and automatically returned to the initial polarization state by the polarization state initialization section.

According to the present invention, the polarization of the ferroelectric capacitance element is inverted upon a rise of the supply voltage. Using the charge generated at this point, a reset signal can be generated rapidly and easily.

According to the present invention, the voltage detection circuit can have a simple structure using the ferroelectric capacitance element.

According to the present invention, a reset signal output section having a structure which is suitable to a voltage detection circuit using the ferroelectric capacitance element and is simple can be realized.

According to the present invention, a reset signal release section for releasing the reset signal after starting the output of the reset signal can be realized with a simple structure.

According to the present invention, an initial polarization state setting section can be realized with a simple structure.

According to the present invention, a polarization state initialization section can be realized with a simple structure.

A reset device (or apparatus) according to the present invention can be easily adopted for a semiconductor IC apparatus.

A semiconductor IC apparatus (or device) adopting a reset device (or apparatus) according to the present invention can be easily adopted for a semiconductor memory apparatus (or device).

Thus, the invention described herein makes possible the advantages of providing a reset device which operates without relying on control by parameters for performing a stable switching operation, reduces power consumption, and guarantees a stable operation even at a low voltage; and a semiconductor IC apparatus and a semiconductor memory apparatus including such a reset device.

These and other advantages of the present invention will become apparent to those skilled in the art upon reading and understanding the following detailed description with reference to the accompanying figures.

BRIEF DESCRIPTION OF THE DRAWINGS

FIG. 2 is a diagram illustrating a hysteresis characteristic of a ferroelectric capacitor FC shown in FIG. 1;

FIG. 3A shows an initial polarization state of the ferroelectric capacitor FC shown in FIG. 1;

FIG. 3B shows a polarization inversion state of the ferroelectric capacitor FC shown in FIG. 1;

FIG. 4 is a circuit diagram illustrating a structure of one conventional power-on reset device.

DESCRIPTION OF THE PREFERRED EMBODIMENTS

Hereinafter, the present invention will be described by way of illustrative examples with reference to the accompanying drawings. In the following examples, the present invention is applied to a power-on reset device.

Figure 1:
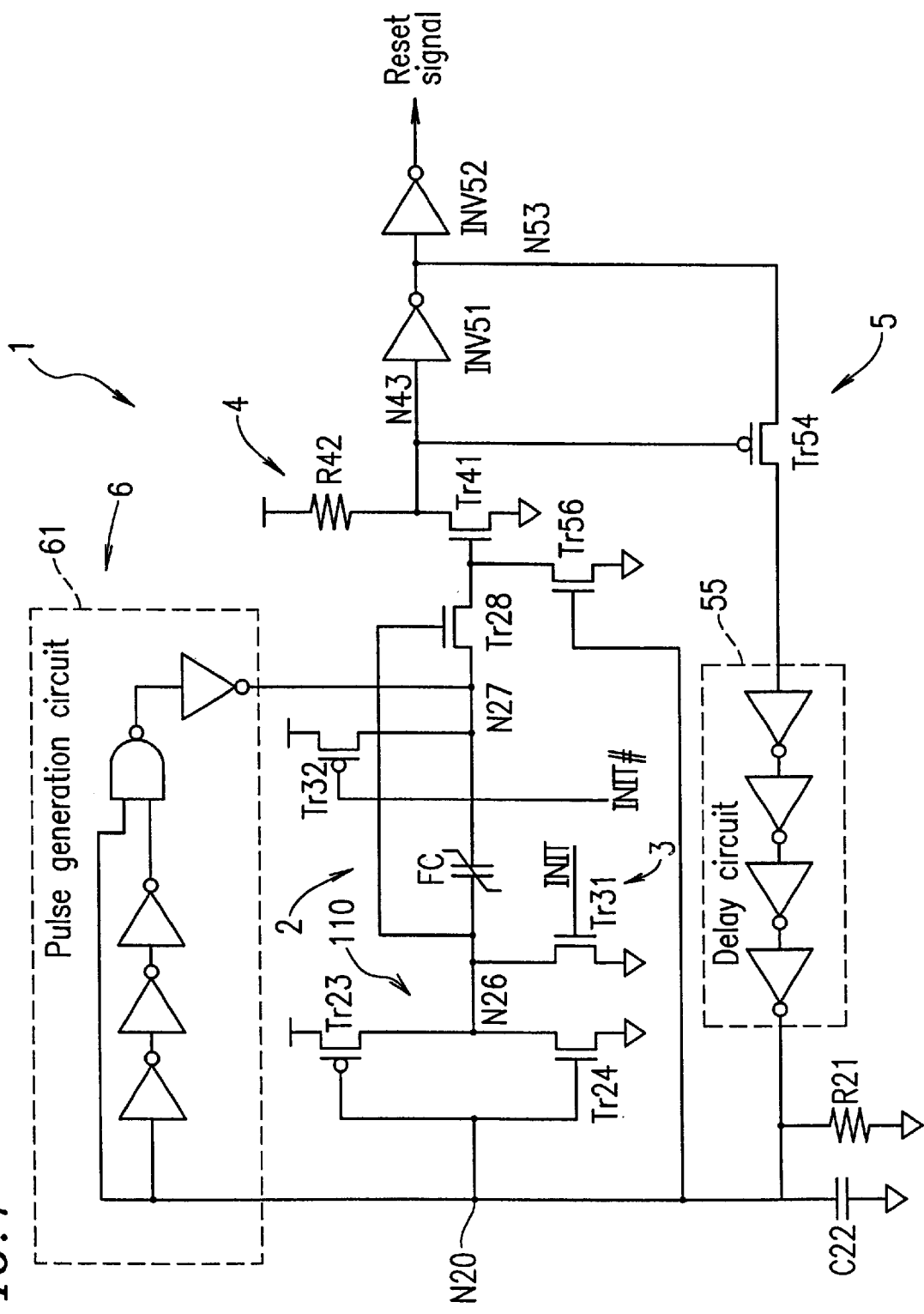
FIG. 1 is a circuit diagram illustrating an example of a structure of a power-on reset device according to one example of the present invention.

FIG. 1 is a circuit diagram illustrating an example of a structure of a power-on reset device 1 according to one example of the present invention. Referring to FIG. 1, the power-on reset device 1 includes a supply voltage detection circuit 2 for detecting a rise of a supply voltage using polarization inversion of a ferroelectric capacitor FC as a ferroelectric capacitance element, a polarization state setting circuit 3 (initial polarization state setting section) for determining the polarization state of the ferroelectric capacitor FC, a reset signal output circuit 4 for detecting the rise of the supply voltage so as to generate a reset signal, a reset signal release section 5 for releasing the reset signal, and a polarization state initialization circuit 6 for returning the polarization state of the ferroelectric capacitor FC to an initial polarization state after the reset signal is released.

The supply voltage detection circuit 2 has the following structure. One of two ends of a pull-down resistor R21 for pulling down a node N20 to a logical "low" state when the power is turned on and one of two ends of a dielectric capacitor C22 (dielectric capacitance element) are grounded. The other ends of the pull-down resistor R21 and the dielectric capacitor C22 are connected to a gate (control terminal) of a first inverter 110 including a p-channel transistor Tr23 and an n-channel transistor Tr24. A node N26 at an output of the inverter 110 is connected to one of two ends of the ferroelectric capacitor FC, and an node N27 at the other end of the ferroelectric capacitor FC is connected to a source (driving terminal) of a first pass transistor Tr28 for gating signal transmission. The node N26 is connected to a gate of the first pass transistor Tr28.

The polarization state setting circuit 3 has the following structure. A drain of a pull-down n-channel transistor Tr31 having a source which is grounded, is connected to the node N26. A drain of a pull-up p-channel transistor Tr32, having a source connected to the power supply, is connected to the node N27. Due to such a structure, the initial polarization state of the ferroelectric capacitor FC is set. To a gate of the pull-down n-channel transistor Tr31, apolarization state setting signal INIT for controlling the initialization of the ferroelectric capacitor FC is input. To a gate of the pull-up p-channel transistor Tr32, a polarization state setting signal INIT# for controlling the initialization of the ferroelectric capacitor FC is input.

The reset signal output circuit 4 has the following structure. A drain (driving terminal) of the first pass transistor Tr28 is connected to a gate of an n-channel transistor Tr41 for driving a reset signal (reset signal driving transistor). A source of the n-channel transistor Tr41 is grounded. A drain of the n-channel transistor Tr41 is connected to one of two ends of a pull-up resistor R42. The other end of the pull-up resistor R42 is connected to the power supply. A node N43 is a connection point between the n-channel transistor Tr41 and the pull-up resistor R42, so that a reset signal is output to the node N43.

The reset signal release circuit 5 has the following structure. The node N43 is connected to a serial circuit including a second inverter INV51 and another inverter INV52 connected in series, so that a reset signal which is output to the node N43 is output via the inverters INV51 and INV52. A node N53 at an output end of the second inverter INV51 is connected to a source of a second pass transistor Tr54 for transmitting the signal from the second inverter INV51. A drain of the second pass transistor Tr54 is connected to a delay circuit 55 including an even number of inverters connected in series. The delay circuit 55 delays a signal by the number of the inverters included therein. A gate of the second pass transistor Tr54 is connected to the node N43 at an input end of the second inverter INV51.

The reset signal release circuit 5 further has the following structure. An output end of the delay circuit 55 is connected to the node N20. The node N20 is connected to a gate of an n-channel transistor Tr56 for releasing a reset signal. A source of the n-channel transistor Tr56 is grounded and a drain of the n-channel transistor Tr56 is connected to the gate of the n-channel transistor Tr41 and to the drain of the first pass transistor Tr28. An output from the delay circuit 55 acts as a signal for releasing a reset signal (reset signal releasing signal). In the example shown in FIG. 1, the delay circuit 55 includes four inverters in series for delaying the signal. The delay circuit 55 can include any even number of inverters in accordance with the required delay time period. The number should be even so that the signal is not inverted between an input end and the output end of the delay circuit 55.

Figure 5:
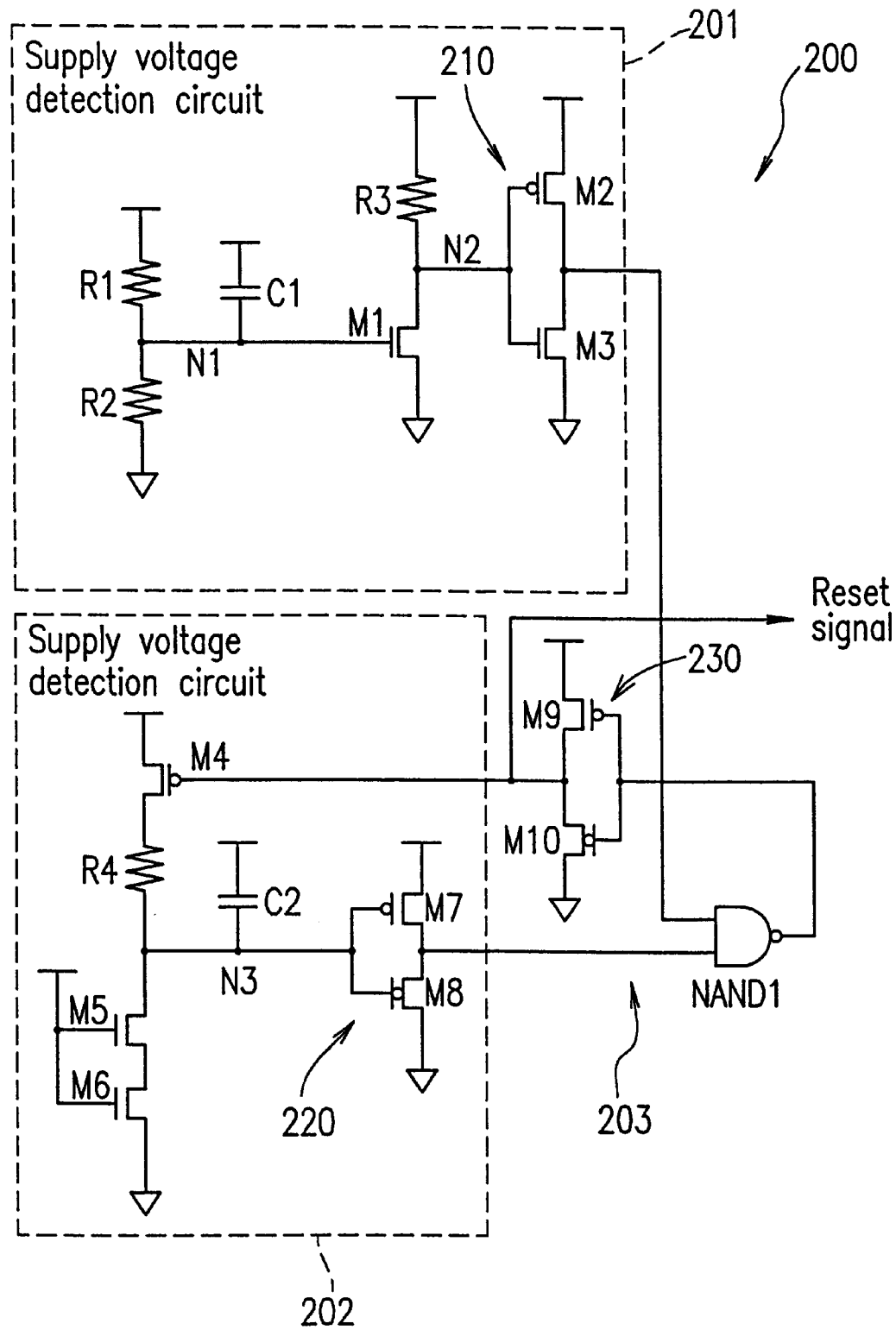
FIG. 5 is a circuit diagram illustrating a structure of another conventional power-on reset device.

The polarization state initialization circuit 6 includes a pulse generation circuit 61. An input end of 20 the pulse generation circuit 61 is connected to the node N20, and an output end of the pulse generation circuit 61 is connected to the node N27. The pulse generation circuit 61 includes an odd number of inverters connected in series. The pulse generation circuit 61 generates a pulse having a width corresponding to the delay time period caused by the number of the inverters connected in series to the node N20 and outputs the pulses to the node N27. In the example shown in FIG. 5, the pulse generation circuit 61 includes three inverters connected in series. The pulse generation circuit 61 can include any odd number of inverters in accordance with the required pulse width. The number should be odd so that the signal is inverted between an input end and an output end of the pulse generation circuit 61.

Hereinafter, the polarization characteristic of the ferroelectric capacitor FC will be described in detail. FIG. 2 shows a hysteresis curve of a ferroelectric material used to form the ferroelectric capacitor FC. A charge amount Q generated by an electric field to the ferroelectric material (represented by a voltage E applied to both ends of the ferroelectric capacitor FC in this example) has a hysteresis characteristic shown in FIG. 2. Immediately after the ferroelectric capacitor FC is produced, i.e., when no electric field has been applied thereto (voltage E=0), the ferroelectric material is not polarized. The charge amount Q generate is zero (point A). When an electric field is applied to the ferroelectric capacitor FC (voltage E>0), the ferroelectric material is polarized, and a charge amount Q is generated in proportion to the magnitude of the electric field. There is a point at which the ferroelectric material is not polarized any further even though the magnitude of the electric field is increased. The amount of polarization at this point is referred to as a saturated polarization value (point B). Even when the magnitude of the electric field is decreased from point B to zero (voltage E=0), the amount of polarization does not become zero but the charge amount Q is kept at a certain value. The amount of polarization at this point is referred to as a residual polarization value (point C). When the electric field is inverted so as to be negative, the polarization is inverted. Then, the charge amount Q reaches a point at which the ferroelectric material is not polarized any further to the negative direction like point B (point D). Even when the electric field is applied in a positive direction so as to return the magnitude of the electric field to zero (voltage E=0), the amount of polarization does not become zero but the charge amount Q is kept at a certain value. The amount of polarization at this point is referred to as a residual polarization value (point E).

Since the ferroelectric capacitor FC has such a hysteresis characteristic, the residual polarization can be utilized to retain information in a non-volatile manner. The ferroelectric capacitor FC has a feature of being transferred into a polarization state in a relatively short time so that the response is fast. Where the electric field required to invert the polarization is Ec and the thickness of the ferroelectric capacitor FC is d, the voltage Vc applied to both ends of the ferroelectric capacitor FC (inversion voltage) is Vc=Ecxd. Since the electric field Ec required to invert the polarization relies on the type of ferroelectric material and the thickness d relies on the structure of the ferroelectric capacitor FC, the value of the voltage Vc relies on the selected type of the ferroelectric material and the selected structure of the ferroelectric capacitor FC. In the case where a film of a PZT (lead zirconate titanate)-based material is used for the ferroelectric capacitor FC, the voltage Vc is as small as about 2.5 V. In the case where a so-called Y1-based material is used for the ferroelectric capacitor FC, the voltage Vc is as small as about 1.7 V. A stable operation is possible at such low levels of voltage. When the thickness d of the ferroelectric capacitor FC is reduced, the voltage Vc can be still lower. Such reduction in the inversion voltage Vc is suitable for semiconductor products for which thin films can be easily fabricated.

An operation of the power-on reset device 1 having the above structure will be described.

First, the polarization state setting circuit 3 determines the polarization state of the ferroelectric capacitor FC as follows.

Immediately after the production of the ferroelectric capacitor FC, i.e., when no electric field has been applied thereto, the ferroelectric material is not polarized (point A in FIG. 2). In order to allow the ferroelectric capacitor FC to act as a circuit element, the initial polarization state of the ferroelectric material needs to be determined. In order to perform such determination, the signal INIT needs to be input to the gate of the pull-down n-channel transistor Tr31 and the signal INIT# needs to be input to the pull-up p-channel transistor Tr32. In other words, the signal INIT is provided with a logical "high" state and the signal INIT# is provided with a logical "low" state, so that the potentials at both ends of the ferroelectric capacitor FC, i.e., the potentials of the nodes N26 and N27, are respectively at the ground level and the power supply level, in order to determine the initial polarization state. The potential difference between the power supply level and the ground level is at least the above-mentioned level of the voltage Vc. Since the node N27 is thus provided with a high potential, the ferroelectric material is polarized as shown in FIG. 3A. Thus, the initial polarization state of the ferroelectric capacitor FC is determined. It is sufficient that the setting of the initial polarization state is conducted only once after the production of the ferroelectric capacitor FC. The setting can be performed either by the manufacturer or the user, but it is appropriate to set the initial polarization state during a test of the power-on reset device 1 including the ferroelectric capacitor FC. After the determination, the signal INIT and INIT# are respectively fixed in the logical "low" state and the logical "high" state so as not to activate the transistors Tr31 and Tr32. The signal INIT and INIT# can be input from an external device, for example, a one-shot pulse generation circuit for generating a one-shot pulse. The signal INIT and INIT# can be introduced in any means, but means which is as simple as possible is preferable since these signals are used only once.

After the initial polarization state of the ferroelectric capacitor FC is set by the polarization state setting circuit 3, the power is turned on in a state of usual use. Immediately after the power is turned on, the dielectric capacitor C22 is not charged since it is pulled down by the resistor R21. Thus, the potential of the node N20 is at the ground level. Therefore, the n-channel transistor Tr24 is inactive and the p-channel transistor Tr23 is activated. As a result, the node N26, which is one of the two ends of the ferroelectric capacitor FC, is provided with the supply voltage. At this point, the node N27, which is the other end of the ferroelectric capacitor FC, is not pulled up by the turning-on of the power. Therefore, when the supply voltage provided to the node N26 exceeds the above-mentioned inversion voltage Vc, the polarization of the ferroelectric capacitor FC is inverted. into the state shown in FIG. 3B. At this point, as shown in FIG. 1, the n-channel transistor Tr41 of the reset signal output circuit 4 detects the polarization inversion of the ferroelectric capacitor FC and thus generates a reset signal. Generation of a reset signal means starting the output of a reset signal and then releasing the reset signal. Before the polarization of the ferroelectric capacitor FC is inverted, the gate potential of the first pass transistor Tr28 exceeds the threshold voltage thereof and thus the first pass transistor Tr28 is activated (i.e., switched on).

Before the supply voltage provided to the node N26 exceeds the above-mentioned inversion voltage Vc, the potential of the node N27 increases by a charge induced by the polarization inversion by the initial setting of the ferroelectric capacitor FC and reaches a logical "high" state. At this point, the potential of the node N26 is the supply voltage which is increasing. When the gate potential of the first pass transistor Tr28 connected to the node N26 exceeds the threshold voltage thereof, the first pass transistor Tr28 is activated and thus the logical "high" potential of the node N27 is transmitted to the gate of the n-channel transistor Tr41. Since the node N20 is in a logical "low" state at this point, the n-channel transistor Tr56 connected to the node N20 is inactive and thus does not influence the logical level of the n-channel transistor Tr41. Therefore, the nchannel transistor Tr41 is activated, and the potential of the node N43 which has been pulled up via the resistor R42 is placed into a logical "low" state. The resistance value of the resistor R42 is set so that the node N43 is in the logical "low" state by a resistance division ratio of the resistance value with respect to the ON resistance value when the n-channel transistor Tr41 is activated. Since the node N43 is placed into the logical "low" state, the reset signal is placed into the active "low" state via the inverters INV51 and INV52 and is output.

The node N43 is in the logical "low" state and the node N53 is in the logical "high" state, and thus the gate of the second pass transistor Tr54 connected to the node N43 is in the logical "low" state. Therefore, the logical "high" level of the node N53 connected to the source of the second pass transistor Tr54 is transmitted to the delay circuit 55 via the drain of the second pass transistor Tr54. The logical "high" level which is input to the delay circuit 55 is transmitted to the node N20 at the output of the delay circuit 55 after the delay time which is set by the delay circuit 55. Thus, the node N20 is transferred from the logical "low" state obtained immediately after the power is turned on to the logical "high" state. When the node N20 reaches the logical "high" state after the delay time required to charge the dielectric capacitor C22, the n-channel transistor Tr24 is activated and thus the node N26 is placed into a logical "low" state. Since the node N26 is placed into the logical "low" state, the first pass transistor Tr28 is deactivated so as to break the signal path between the node N27 and the gate of the n-channel transistor Tr41. Simultaneously, the logical "high" level of the node N20 is input to the gate of the n-channel transistor Tr56 to activate the n-channel transistor Tr56. Thus, the gate of the n-channel transistor Tr41 is placed into a logical "low" state and the n-channel transistor Tr41 is deactivated. Since the n-channel transistor Tr41 is de-activated, the node N43 is pulled up by the resistor R42 into a logical "high" state. The logical "high" state of the node N43 transfers the reset signal into a logical "high" state via the inverters INV51 and INV52. Thus, the reset signal is released. In summary, the reset signal which is in an active "low" state after the power is turned on is output for the delay time period provided by the delay circuit 55, namely, the time period required to charge the dielectric capacitor C22, and then is placed into a logical "high" state and released.

After the reset signal is released, the ferroelectric capacitor FC needs to return of the initial polarization state to be prepared for the next time the power is turned on. When the node N20 is placed into a logical "high" state by an output from the delay circuit 55 acting as a reset signal release signal, the pulse generation circuit 61 operates as follows after receiving the voltage level of the node N20. Upon receipt of the logical "high" level output from the node N20, the pulse generation circuit 61 generates a logical "high" pulse having a pulse width corresponding to a delay time period provided by the number of the inverters included therein. At this point, the node N26, which is one of the two ends of the ferroelectric capacitor FC, is in a logical "low" state, and the node N27, which is the other end of the ferroelectric capacitor FC, receives a logical "high" pulse from the pulse generation circuit 61. Therefore, the polarization of the ferroelectric capacitor FC is inverted and thus initialized back to the state of FIG. 3A. This initial polarization state is kept by the residual polarization even after the power of the system is cut off.

The polarization of the ferroelectric capacitor FC keeps the initial state. Therefore, the next time the power is turned on, the reset signal starts being output and then released to return the polarization of the ferroelectric capacitor FC to the initial polarization state by the same operation as above. Thus, the ferroelectric capacitor FC can be ready for the following time the power is turned on.

As described above, according to the present invention, the ferroelectric capacitor FC is used for the power-on reset device 1. Owing to the ferroelectric capacitor FC, a rise of the supply voltage when the power is turned on can be detected as a polarization inversion and thus a reset signal can be generated. Since the polarization of the ferroelectric capacitor FC is stably inverted even at a relatively low voltage, a reset signal can be stably generated in a system having a relatively low supply voltage. In addition, a serial path through which a current constantly flows is not necessary, a stable operation is guaranteed in a system required to operate at reduced power consumption. In order to realize a stable operation at a low supply voltage, the polarization inversion voltage can be reduced.

Since the rise of the supply voltage is detected only using the polarization inversion voltage of the ferroelectric capacitor FC, a conventional circuit configuration relying on the speed of the rise of the supply voltage is not necessary. Thus, the circuit configuration can be simplified.

Unlike the conventional art, the operation of a reset device according to the present invention does not heavily rely on the typical analog parameters such as the capacitance values of the capacitors, the resistance values of the resistors and the characteristics of the transistors, these values and characteristics can be more easily designed. A dispersion in the values and characteristics, caused by factors related to the production or other factors such as temperature or the like, does not substantially influence the generation of the reset signal.

As described above, the polarization inversion voltage of the ferroelectric material can be reduced as the thickness of a ferroelectric capacitor FC is reduced, although the level of the polarization inversion voltage varies in accordance with the type of ferroelectric material or the like. The ferroelectric capacitor FC is suitable to be used in various semiconductor IC apparatuses (or devices) for which thin films are easily fabricated. Such semiconductor IC apparatuses are encompassed in the scope of the present invention although no specific example is provided in the above example.

One type of a semiconductor memory apparatus is a so-called ferroelectric memory apparatus or device. The ferroelectric memory apparatus is a non-volatile memory using a ferroelectric material. Due to the alignment in the semiconductor process, a semiconductor IC apparatus (or device) including a reset device according to the present invention is preferably usable in such a semiconductor memory apparatus (or device). Such a semiconductor memory apparatus (or device) is encompassed in the scope of the present invention although no specific example is provided in the above example.

The present invention is also preferably applicable to a power-on reset circuit of a microcomputer including a ferroelectric memory built therein. Such a microcomputer is now used in a wide variety of applications including a non-contact IC card, which is today a target of attention.

According to the present invention, the ferroelectric capacitance element provided in the voltage detection circuit keeps a residual polarization due to the hysteresis characteristic thereof and thus does not charge or discharge relying on time unlike a dielectric capacitor. Therefore, consumption of a current during the operation of the circuit and a serial path required in the conventional art can be eliminated. As a result, constant current consumption is eliminated, resulting in reduced power consumption. By selecting an appropriate ferroelectric material used for the ferroelectric capacitance element and an appropriate thickness of the ferroelectric capacitance element, the polarization inversion voltage can be minimized. Thus, a stable operation is guaranteed even at a low voltage. The polarization caused to the ferroelectric material is spontaneous polarization induced by the electric field applied thereto and thus does not accompany injection or release of charges to or from an external device unlike the dielectric capacitor. Therefore, the polarization inversion is performed rapidly. The polarization inversion is controlled only by an electric field, i.e., a voltage supplied from an external device. Therefore, the polarization inversion does not rely on the rising time of the voltage, and a voltage detection circuit which is sufficiently easily controlled is realized. As a result, a reset circuit providing a stable operation is realized.

According to the present invention, a reset signal can start being output and then be released relatively easily using a polarization characteristic of the ferroelectric capacitance element.

According to the present invention, the initial polarization state of the ferroelectric capacitor can be easily and arbitrarily determined by the initial polarization state setting section.

According to the present invention, after the supply voltage rises to release the reset signal, the polarization state of the ferroelectric capacitance element can be easily and automatically returned to the initial polarization state by the polarization state initialization section.

According to the present invention, the polarization of the ferroelectric capacitance element is inverted upon a rise of the supply voltage. Using the charge generated at this point, a reset signal can be generated rapidly and easily.

According to the present invention, the voltage detection circuit can have a simple structure using the ferroelectric capacitance element.

According to the present invention, a reset signal output section having a structure which is suitable to a voltage detection circuit using the ferroelectric capacitance element and is simple can be realized.

According to the present invention, a reset signal release section for releasing the reset signal after starting the output of the reset signal can be realized with a simple structure.

According to the present invention, an initial polarization state setting section can be realized with a simple structure.

According to the present invention, a polarization state initialization section can be realized with a simple structure.

A reset device (or apparatus) according to the present invention can be easily adopted for a semiconductor IC apparatus.

A semiconductor IC apparatus (or device) adopting a reset device (or apparatus) according to the present invention can be easily adopted for a semiconductor memory apparatus (or device).

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A reset device for detecting a rise of a supply voltage to start outputting a reset signal and then to release the reset signal, the reset device comprising a voltage detection circuit for detecting the supply voltage, wherein the voltage detection circuit includes a ferroelectric capacitance element for detecting a rise of the supply voltage and the voltage detection circuit detects the rise of the supply voltage by a polarization inversion so that the reset signal is generated by a transfer of a potential of the ferroelectric capacitance element caused by the polarization inversion.

2. A reset device according to claim 1, further comprising a reset signal output section for generating a reset signal using a polarization characteristic of the ferroelectric capacitance element, and a reset signal release section for releasing the reset signal.

3. A reset device according to claim 2, further comprising an initial polarization state setting section for determining a polarization state of the ferroelectric capacitance element.

4. A reset device according to claim 3, further comprising a polarization state initialization section for returning the polarization state of the ferroelectric capacitance element to an initial polarization state after the reset signal is released.

5. A reset device according to claim 4, wherein the polarization state initialization section includes a pulse generation circuit having an input end connected to an input end of a first inverter of the voltage detection circuit, the polarization state initialization section generating a polarization state initialization pulse from an output end thereof to a second end of the ferroelectric capacitance element.

6. A reset device according to claim 2, wherein the reset signal release section includes a second inverter, a second pass transistor, a delay circuit, and a reset signal release transistor, wherein:
a connection point between a pull-up resistor and a reset signal driving transistor is connected to an input end of the second inverter,
the input end of the second inverter is connected to a control terminal of the second pass transistor,
an output end of the second inverter is connected to one of two driving terminals of the second pass transistor,
the other driving terminal of the second pass transistor is connected to an input end of a first inverter via the delay circuit,
the input end of the first inverter is connected to a control terminal of the reset signal release transistor,
one of two driving terminals of the reset signal release transistor is connected to a control terminal of the reset signal driving transistor, and
the other driving terminal of the reset signal release transistor is grounded.

7. A reset device according to claim 2, wherein the reset signal output section includes a reset signal driving transistor and a pull-up resistor, wherein:
a second end of the ferroelectric capacitance element is connected to a control terminal of the reset signal driving transistor via a first pass transistor, which has a control terminal connected to an output end of a first inverter,
one of two driving terminals of the reset signal driving transistor is connected to a first end of the pull-up resistor, which has a second end connected to a power supply, and
the other driving terminal of the reset signal driving transistor is grounded.

8. A reset device according to claim 7, wherein the reset signal release section includes a second inverter, a second pass transistor, a delay circuit, and a reset signal release transistor, wherein:
a connection point between the pull-up resistor and the reset signal driving transistor is connected to an input end of the second inverter,
the input end of the second inverter is connected to a control terminal of the second pass transistor,
an output end of the second inverter is connected to one of two driving terminals of the second pass transistor,
the other driving terminal of the second pass transistor is connected to an input end of the first inverter via the delay circuit,
the input end of the first inverter is connected to a control terminal of the reset signal release transistor,
one of two driving terminals of the reset signal release transistor is connected to the control terminal of the reset signal driving transistor, and
the other driving terminal of the reset signal release transistor is grounded.

9. A reset device according to claim 2, further comprising a polarization state initialization section for returning a polarization state of the ferroelectric capacitance element to an initial polarization state after the reset signal is released.

10. A reset device according to claim 9, wherein the polarization state initialization section includes a pulse generation circuit having an input end connected to an input end of a first inverter of the voltage detection circuit, the polarization state initialization section generating a polarization state initialization pulse from an output end thereof to a second end of the ferroelectric capacitance element.

11. A reset device according to claim 3, wherein the polarization state initialization section has a structure in which a pull-down transistor is connected to a first end of the ferroelectric capacitance element, and a pull-up transistor is connected to a second end of the ferroelectric capacitance element.

12. A reset device according to claim 1, further comprising an initial polarization state setting section for determining a polarization state of the ferroelectric capacitance element.

13. A reset device according to claim 12, further comprising a polarization state initialization section for returning the polarization state of the ferroelectric capacitance element to an initial polarization state after the reset signal is released.

14. A reset device according to claim 13, wherein the polarization state initialization section includes a pulse generation circuit having an input end connected to an input end of a first inverter of the voltage detection circuit, the polarization state initialization section generating a polarization state initialization pulse from an output end thereof to a second end of the ferroelectric capacitance element.

15. A reset device according to claim 12, wherein the polarization state initialization section has a structure in which a pull-down transistor is connected to a first end of the ferroelectric capacitance element, and a pull-up transistor is connected to a second end of the ferroelectric capacitance element.

16. A reset device according claim 1, wherein:
the voltage detection circuit includes a first inverter,
an input end of the first inverter is grounded via a dielectric capacitance element and pull-down resistor, and
an output end of the first inverter is connected to a first end of the ferroelectric capacitance element.

17. A reset device according to claim 1, wherein:

the voltage detection circuit includes a first inverter, an input end of the first inverter is grounded via a dielectric capacitance element and a pull-down resistor, and an output end of the first inverter is connected to a first end of the ferroelectric capacitance element.

18. A semiconductor IC apparatus including the reset device according to claim 1 which is formed using a semiconductor material.

19. A semiconductor memory apparatus including the semiconductor IC apparatus according to claim 18.

* * * * *